United States Patent

[11] 3,614,225

[72] Inventors Donald Dinella
Clark Township, Union County;
Eckert Franz Schutz, Edison Township,
Middlesex County, both of N.J.
[21] Appl. No. 874,446
[22] Filed Nov. 6, 1969
[45] Patented Oct. 19, 1971
[73] Assignee Western Electric Company, Incorporated
New York, N.Y.

[54] PHOTOPRINTING APPARATUS
7 Claims, 8 Drawing Figs.

[52] U.S. Cl. 355/85, 355/119, 355/121, 355/133
[51] Int. Cl. G03b 27/04
[50] Field of Search 355/85, 133, 78, 79, 80, 99, 121, 119; 240/46.55

[56] References Cited
UNITED STATES PATENTS
1,548,294 8/1925 Wilkinson 240/46.55
1,838,312 12/1931 Kanolt 355/133

*Primary Examiner*—Samuel S. Matthews
*Assistant Examiner*—Richard L. Moses
*Attorneys*—W. M. Kain, R. P. Miller and W. L. Williamson

ABSTRACT: A temperature-controlled parabolic reflector, for reflecting an essentially parallel light beam, is employed to direct light from a light source to an image master spaced a predetermined distance from a printed circuit board to expose certain portions of a photoresist to define a circuit pattern. Electrical circuits are subsequently formed by electroless copper plating to the areas exposed by the pattern.

INVENTORS
D. DINELLA
E. F. SCHUTZ
By W. L. Williamson
ATTORNEY

PHOTOPRINTING APPARATUS

BACKGROUND OF THE INVENTION

This invention relates to photoprinting apparatus, and more particularly, to a photoprinting apparatus for exposing electrical circuit patterns on printed circuit boards.

In the fabrication of printed circuit boards, an important step is the generation of a circuit or circuits on one or both sides of a board. Generation of the circuit is a precise art often requiring complicated apparatus due to the fact that the circuit paths to be formed are small in size yet their relative positions must be accurate to preclude overlapping of the paths which, in turn, would cause electrical shorts. Typical dimensions experienced in the art are separation distances and path widths of approximately 2 mils each. In addition, continuity of the circuit paths must be assured as well as the accuracy of location to permit connection to other circuits and any electrical components.

One common technique of generating an electrical circuit on a circuit board is to apply a photoresist to the circuit board and to employ an image master or mask to expose preselected areas of the photoresist to light or radiant energy from a suitable light source. The photoresist is then developed to remove unexposed portions of the photoresist thereby selectively uncovering or exposing portions of the circuit board to define a desired circuit pattern A conductive material such as copper is subsequently deposited onto the uncovered or exposed portions of the circuit board to form the desired circuit. The photoresist may either be exposed by spacing the mask a predetermined distance from the photoresist, noncontact printing, or by applying the mask directly to the photoresist, contact printing. When noncontact printing is employed to expose a photoresist, it is necessary to use collimated light in order to obtain the required pattern definition. However, when a collimating lens is employed, the area over which collimated light can be applied is limited by the diameter of the collimating lens. As the cost of a lens as well as the difficulty in obtaining a good quality lens increases significantly with the diameter of the lens, it rapidly becomes difficult if not impossible to employ noncontact printing when large areas are involved. As a result, it is the usual practice to use contact printing for large areas.

However, in contact printing, it is not unusual to damage either the photoresist or the mask when the mask is applied to the photoresist and cumbersome techniques are required to obtain proper contact between the mask and the photoresist. For example, a vacuum may be employed to draw the mask down onto the photoresist. In addition, when it is necessary to expose a photoresist over curved areas of the circuit board, it is extremely difficult to insure proper contact between the mask and the photoresist.

The prior art devices suffer from such disadvantages as the use of lenses, which are costly to manufacture, subject to damage, and which introduce light defraction and frequency attenuation. Mask to workpiece contact damages both upon frequent use and is undesirable when working with highly sensitive or fragile workpiece surfaces. The pressure or vacuum work areas, used to effect mask to workpiece contact, are similary undesirable since precious time is needed to achieve either the proper pressure level or program vacuum. In addition, the additional equipment needed to operate, maintain and control such pressures or vacuums is costly when considering the high quantity of workpieces handled on a mass production basis.

Highly desirable would be an apparatus that would accurately generate precise electrical circuit patterns on a printed circuit board yet be simple to construct, operate and maintain. Preferably, the photoprinting apparatus should need no lenses, no mask to workpiece contact, no pressure or vacuum work areas and yet possess the capability of exposing large area patterns as well as patterns over curved areas.

It is, therefore, an object of this invention to provide an apparatus for exposing a photresist in a desired pattern.

Another object of this invention is to provide an apparatus for exposing a photoresist to define an electrical circuit pattern on a printed circuit board.

A further object of this invention is to provide apparatus for exposing a photoresist to define electrical circuit interconnection patterns on curved areas of an article such as on the edge and hole portions of a printed circuit board.

A still further object of this invention is to provide an apparatus that exposes a photoresist to define electrical circuit patterns on printed circuit boards without the need of a complicated lens system, mask to workpiece contact, pressure or vacuum work areas, or workpiece size restrictions.

SUMMARY OF THE INVENTION

With these and other objects in view, this invention relates to a photoprinting apparatus for exposing a photoresist in a desired pattern, for example, a circuit pattern on a printed circuit board. The apparatus includes a light source, means for reflecting light rays emanating from the light source to collimate the light rays, a workpiece holder and an image master spaced from the workpiece holder and disposed to intercept the collimated light rays to transmit a portion thereof so as to expose a photoresist on a workpiece held in the workpiece holder in a desired pattern. In addition, a slight deviation in the light rays may be introduced to expose edge and hole portions of the workpiece.

DETAILED DESCRIPTION

Referring now to FIGS. 1–6, a detailed description of the invention will be given. Although the principles of the invention are hereinafter discussed with reference to printed circuit boards, the invention is not restricted to the exposure of a photoresist to define electrical circuit patterns on surfaces thereof, but has general application to the exposure of photoresist to define patterns on workpieces in general.

Figures 1, 2, 3, 4, 5, 6:
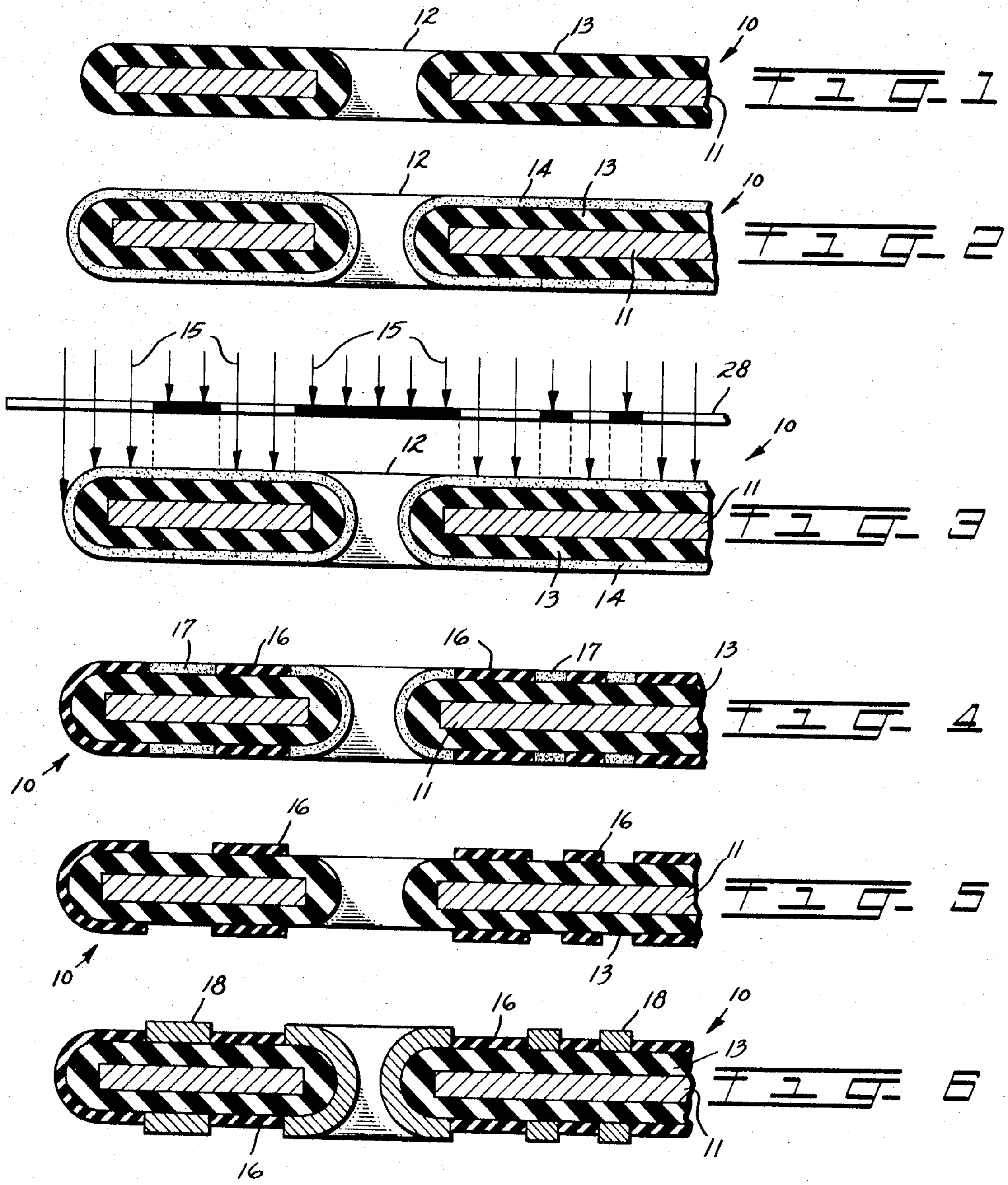
FIGS. 1 through 6 are side elevational views of the workpiece, in section, at various stages of fabrication of the printed circuit board.

FIGS. 1–6 show, in general, the various steps in the fabrication of printed circuit boards in practicing the invention hereinafter discussed. As shown in FIG. 1, a printed circuit board 10 comprises a substrate 11 containing a hole 12, and is coated with a suitable epoxy resin layer 13. A typical example would be a steel substrate coated with a catalytic epoxy resin. Following coating of the layer 13, a photoresist 14 is applied either by dipping or spraying in an airless-spray system. Thereafter the resist is prebaked to achieve the proper processing characteristics.

The following step, as shown in FIG. 3, involves the use of the apparatus which is the subject of this invention wherein the selected areas of photoresist 14 are exposed to essentially parallel light rays 15—15 to form a desired pattern. The coated substrate is transported into a work area and registered within the apparatus, as will be described hereinafter in detail. Emission of the light rays, which is directed along a predetermined path, causes a pattern to be generated comprising exposed areas 16 and unexposed areas 17 (FIG. 4). In this particular embodiment, the exposed areas 16 remain whereas the unexposed areas 17 are developed and hence removed to uncover or expose the desired areas of the catalytic epoxy resin layer 13 (FIG. 5). These desired areas constitute a pattern. Finally, as shown in FIG. 6, copper 18 is deposited in the areas defined by the exposed catalytic epoxy resin layer 13.

In an exemplary embodiment, the structure of the apparatus 20 is as follows. In the description, reference will be made to one shutter 27, one mask or image master 28, one master holder 29, and one workpiece 31. It is to be understood, however, that a plurality of workpieces 31 could be photoprinted simultaneously depending upon the desired size of the apparatus 20 and the number of shutters 27, image masters 28, and master holders 29.

Figure 7:
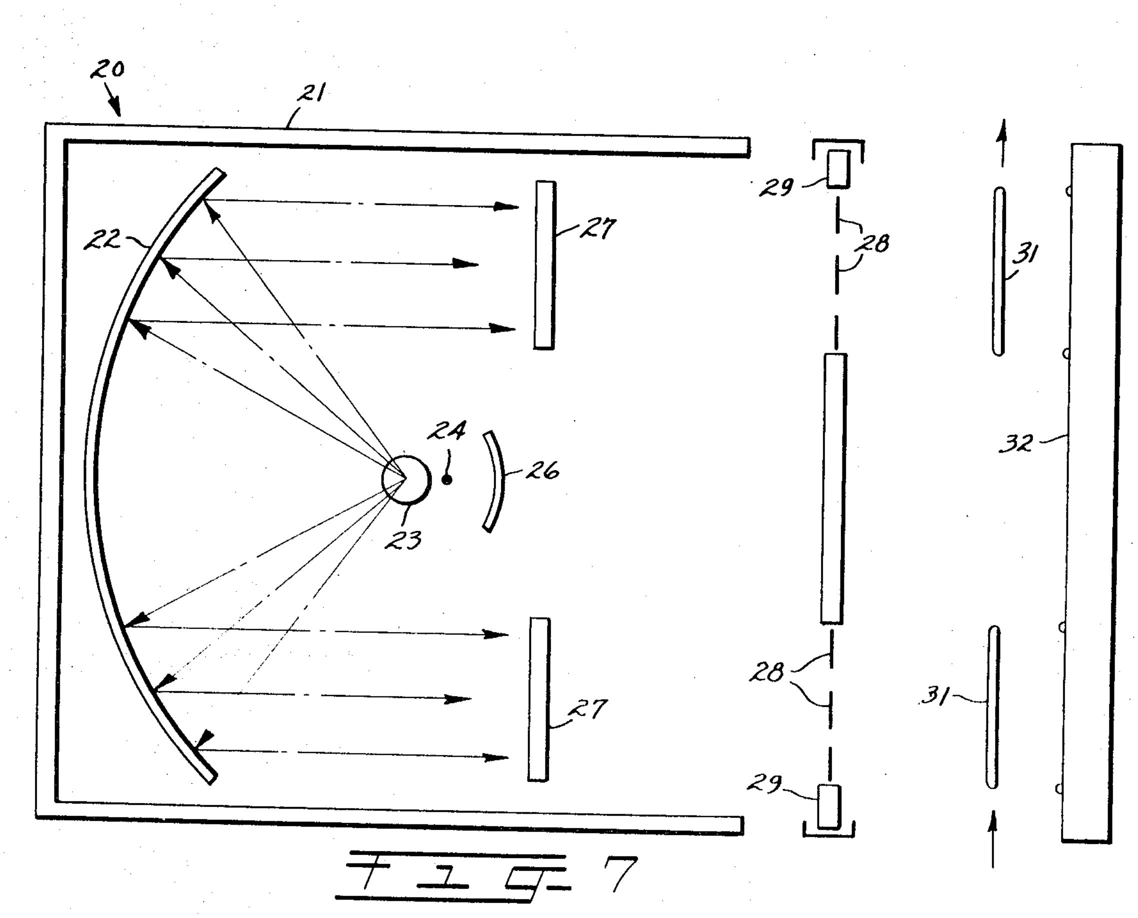
FIG. 7 is a top elevational view of the apparatus suitable for practicing an examplary embodiment of the invention.

As shown in FIG. 7, the apparatus 20 includes a suitable lamp house 21 which is temperature controlled by flowing air (not shown) through the lamp house 21. A thermostatic control is advantageously employed so that the high temperature caused by emission of the rays of lamp source 23 will not adversely affect the parts within the lamp house 21. For example, the introduction of air at a flow rate of 600 cubic feet per minute into the lamp house 21 at controlled intervals, has been found to satisfactorily control the temperature within the lamp house 21. Located near one end of the lamp house 21 is a parabolic reflector 22 which possesses a very high reflection capability and has, for example, a focal length of 9¾ inches. The light source 23 is essentially a point source and may be of the mercury-xenon or mercury type such as type 929BU manufactured by Hanovia Company, Inc.

Referring again to FIG. 3, it should be appreciated that in order to properly expose the photoresist areas the upper surface of the circuit board 10, the light rays 15—15 should be collimated, i.e., parallel to each other. Any lack of parallelism tends to reduce the definition of the circuit pattern. In other words, the line dividing exposed areas 16 and unexposed areas 17 is most sharply defined when light rays 15—15 are precisely parallel and becomes increasingly less sharply defined as the light rays 15—15 lose collimation. On the other hand, if the light rays 15—15 are precisely parallel, then areas of the circuit board which are essentially parallel to the light rays are not properly exposed. For example, the photoresist may not be properly exposed at the edges of the circuit board or along the sidewalls of holes in the circuit board. In order to properly expose these portions of the circuit board, a controlled amount of deviation or lack of parallelism must be introduced. The deviation must be carefully controlled to permit proper exposure of edge and hole portions of the circuit board without deleteriously effecting the definition of the circuit pattern.

It will be appreciated by one skilled in the art that the degree of collimation achieved depends on a number of factors. Only if the reflector 22 is a perfect parabola and the light source 23 a true point source will perfect collimation be achieved. Since the light source is not a point source, the light rays are not perfectly collimated even if the parabola is a perfect parabola. In reality a circle of confusion is formed which must be kept within a prescribed range in order to achieve the desired results.

Whenever the shape of a parabolic reflector is tested, a collimated light source is placed along the centerline or axis of the reflector. If the reflector is a perfect parabola and the light source a true point source, the light rays reflected from the parabola will converge to a point at the focal point 24 of the parabola. In practice, a point of convergence is never achieved. Instead, a circle of confusion is created as a result of the reflector not being a perfect parabola and the light source being larger than a point source. For example, when the light source is an arc source, light emanates from the arc itself as well as from a "hot spot" located at the cathode. This dual light emission is a cause of concern but can be tolerated if used in conjunction with a substantially parabolic reflector. The circle of confusion is measured in inches and is given as the diameter of the spot formed at the focal plane of the parabolic reflector. Thus, for purposes of this invention, if the refelector allows better than a 0.04-inch circle of confusion, a desirable principal beam will be emitted as well as an undesirable hot spot beam emanating at an angle to the principal beam. Alternately, if the reflector has a circle of confusion worse than 0.10 inch, the emanating light will diffuse too much and near collimation will not be achieved.

When it is necessary to expose portions of a workpiece which are essentially parallel to the axis of the reflector, the light source 23 is advantageously displaced from the focal point 24 a predetermined distance, for example, 1 inch, along the centerline of the reflector to introduce a controlled amount of deviation. It has been found that a 1 percent deviation is sufficient to achieve proper exposure of portions of the workpiece which are parallel to the centerline of the reflector without deleteriously affecting the definition of the circuit pattern. When the workpiece is perpendicular to the centerline of the reflector, the deviation can be calculated by multiplying the tangent of the angle of incidence of the light rays on the workpiece by 100. It should be understood that it is immaterial whether the light rays are convergent or divergent and, therefore, it does not matter whether the light source is displaced towards the reflector or away from the reflector.

A secondary reflector 26 possessing a high reflection capability, is positioned approximately 5 inches from the light source 23 along the centerline of the lamp house 21. The secondary reflector 26 serves to refocus front-emitted light from light source 23 back to light source 23 while simultaneously acting as a shield to block direct light from the other working parts. Blockage, of course, is necessary in order to prevent the noncollimated front-emitted light from reaching the mask 28 and the workpiece 31. The secondary reflector 26 is hence positioned such that the reflected light rays refocus on the light source 23 and not the focal point 24. An added advantage of the use of such a reflector 26 is the more efficient use of the emitted light.

Positioned adjacent the centerline of the lamp house 21, and within a direct path of the projected light rays, is a shutter 27. The shutter 27 serves to allow light to pass to the workpiece 31 when desired to control exposure time, the duration of which is between 5–10 seconds. Located directly behind the shutter 27 is an image master 28 held in place by master holder 29. Basically, the image master 28 comprises a transparent glass substrate which supports a metal pattern on a surface thereof. The metal pattern should be relatively thin, for example, 1,200 angstroms thick so as not to block a portion of the light rays where the deviated light strikes the end of the metal pattern before it passes through the glass substrate. That is, if the metal pattern is too thick, only substantially collimated light will pass through the image master. Thus, the deviated light will be blocked entirely or else be reflected a number of times off the sides of the metal pattern as the rays pass through the image master thereby striking undesired areas of the photoresist.

The image master 28, for purposes of this invention, is the same size as the workpiece 31. A conveyor-supported clamp (not shown) serves to hold the workpiece 31 in the working position within the lamp house 21 a predetermined distance from the image master, for example, one-eighth inch. A registration mechanism 32, of any conventional type, is employed to accurately register the workpiece with the image master 28.

The apparatus 20 operates as follows. A printed circuit board, prepared as shown in relation to FIG. 2, is conveyed into the lamp house working area 21 where it is accurately positioned by registration mechanism 32. Light rays emanating from light source 23 are reflected from the parabolic reflector 22 in a substantially parallel path to the shutter 27. Within the context of this description, of course, substantially parallel means a slight collimation deviation, the deviation being necessary to expose the edge and hole portions of the workpiece 31. Opening of the shutter 27, in turn, allows the projected light rays to contact the image master 28.

In conformity with the desired pattern on the image master 28, areas of light are in turn allowed to pass to the workpiece 31 to expose certain areas 16 on the photoresist 14 as shown in FIG. 4. Thereafter, the unexposed areas, as shown in FIGS. 3, 4 and 5, are developed using a conventional chemical such as xylene. The developer is sprayed onto the workpiece 31 for a period of approximately 1 minute. Immediately thereafter, the workpiece 31 is subjected to a 30-second water rinse to remove the developer and the unexposed resist thus revealing the underlying epoxy-coated board. Then the workpiece is air-dried and post-baked.

Figure 8:
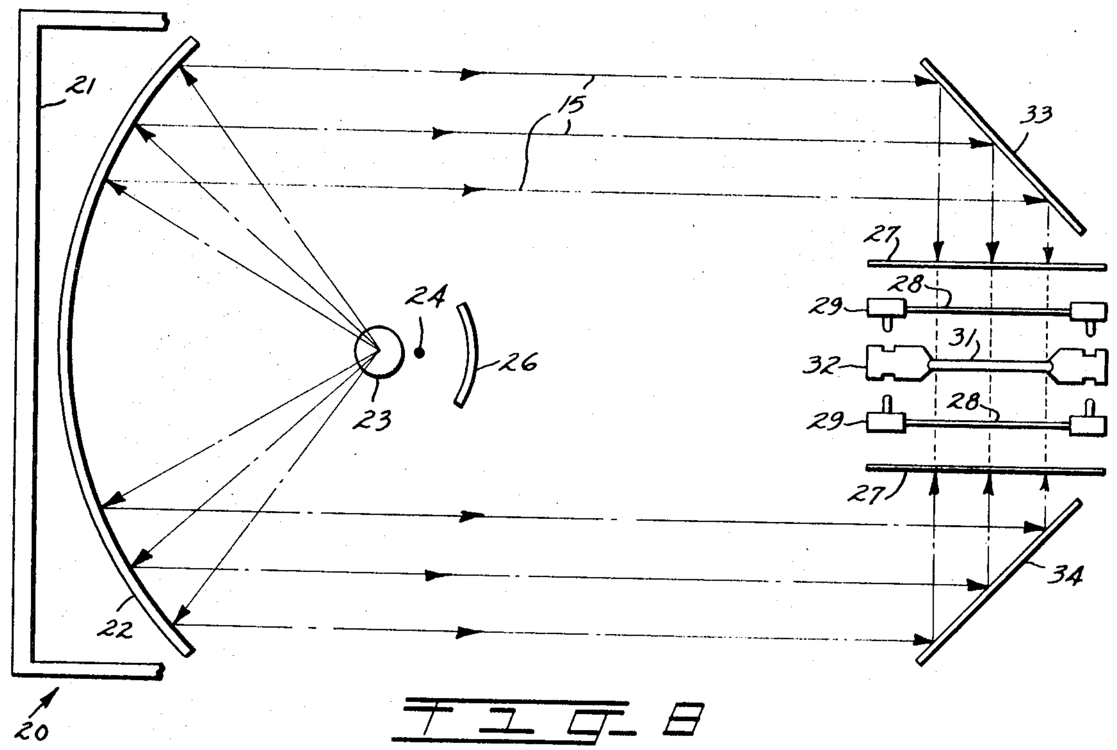
FIG. 8 is a top elevational view of an alternate embodiment of FIG. 7

In an alternate embodiment as shown in FIG. 8, by changing the position of the two shutters 27 and two image masters 28 and by the inclusion of two substantially flat reflectors 33, 34 both sides of the workpiece 31, including the edge and hole portions thereof, may be exposed simultaneously. The two flat reflectors 33, 34 as shown in FIG. 8, are disposed at 45° angles to the centerline of the lamp house 21. Being in the direct path of the substantially parallel light rays, these reflectors 33, 34 reflect the light rays at substantially right angles towards each other and towards the shutters 27, image masters 28 and the workpiece 31. The slight deviation from perfect collimation is sufficient to cause the light rays to reach the edge and hole portions of the workpiece 31 to expose any desired area should interconnection of the pattern on both sides of the workpiece 31 be desired. Thus, an electrical circuit pattern on each side of the workpiece 31 is exposed simultaneously. In addition, the areas where the patterns interconnect each other, via the edges of the workpiece or via the holes, are exposed. Since all these areas are exposed during a single exposure period, a large quantity of workpieces 31 may be processed on a mass production basis within a minimum of time hence achieving a greater measure of economical productivity.

As will be appreciated by one skilled in the art, additional embodiments may be used without departing from the spirit and scope of the present invention. For example, in lieu of the alternate embodiment hereinbefore described, two exemplary embodiments of the apparatus 20 may be linked in reciprocal relationship such that an electrical circuit pattern may be first exposed on one side, and then the other side of the workpiece 31. Then, too, the size of the apparatus 20 and its corresponding parts may be varied so as to create a working area up to 200 square inches in size. Nevertheless, what is herein disclosed is merely illustrative and may be further modified and departed from in many ways without departing from the spirit and scope of the invention.

What is claimed is:

1. An apparatus for exposing a wide area of a photoresist on a workpiece in a desired pattern comprising:
   a light source;
   parabolic reflector means for reflecting light rays emanating from said light source to collimate said light rays;
   a workpiece holder; and
   an image master spaced from said workpiece holder and disposed to intercept said collimated light rays to transmit a portion thereof so as to expose selected portions of the photoresist in a desired pattern.
   and wherein
   the light source is positioned a predetermined distance form the focal point of said parabolic reflector to introduce a predetermined amount of deviation from collimation to expose edge and hole portions of said workpiece.

2. The apparatus according to claim 1 wherein:
   the parabolic reflector has a circle of confusion of between 0.04 inch and 0.10 inch and the light source is positioned a sufficient distance from the focal point of the parabolic reflector to introduce a deviation from collimation of 1 percent.
3. Photoprinting apparatus comprising:
   a parabolic reflector;
   a light source positioned a predetermined distance from the focal point of said parabolic reflector so that light rays reflected from said parabolic reflector are substantially collimated;
   a secondary reflector located a predetermined distance from said light source and in a reciprocal relationship to said parabolic reflector, for refocusing front emitted light back to said light source;
   at least one shutter positioned within a direct path of the collimated light rays;
   at least one image master positioned directly behind said shutter;
   means for holding at least one workpiece at a predetermined distance from said image master; and
   registration means for accurately positioning said workpiece behind said image master whereby the collimated light rays pass through said shutter and are intercepted by said image master to expose selected areas of said workpiece to said light rays.
4. Photoprinting apparatus according to claim 3 wherein:
   the circle of confusion of the apparatus is within the range of 0.04 inch to 0.10 inch.
5. Photoprinting apparatus according to claim 3 wherein:
   said light source is positioned a predetermined distance from the focal point of said parabolic reflector to allow the light rays to deviate slightly from perfect collimation.
6. Photoprinting apparatus according to claim 5 wherein:
   the collimation deviation is 1 percent.
7. Photoprinting apparatus according to claim 3 wherein:
   two substantially flat reflectors are disposed at 45° angles to the centerline of said parabolic reflector to allow the light rays reflected from said parabolic reflector to be reflected at substantially right angles toward each other, whereby the light rays reflected from each of said flat reflectors converge towards each other and pass through a separate shutter and image master to simultaneously expose a predetermined pattern on each side of said workpiece.